United States Patent
Kubouchi et al.

(10) Patent No.: US 10,164,530 B2
(45) Date of Patent: *Dec. 25, 2018

(54) BOOST CHOPPER CIRCUIT INCLUDING SWITCHING DEVICE CIRCUIT AND BACKFLOW PREVENTION DIODE CIRCUIT

(71) Applicant: FUJI ELECTRIC CO., LTD., Kawasaki-shi, Kanagawa (JP)

(72) Inventors: Motoyoshi Kubouchi, Matsumoto (JP); Hao Hou, Yokkaichi (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/414,912

(22) Filed: Jan. 25, 2017

(65) Prior Publication Data

US 2017/0264197 A1    Sep. 14, 2017

(30) Foreign Application Priority Data

Mar. 14, 2016 (JP) ................. 2016-049761

(51) Int. Cl.
| | | |
|---|---|---|
| *H02M 3/158* | (2006.01) | |
| *H02M 7/00* | (2006.01) | |
| *H01L 25/00* | (2006.01) | |
| *H02M 7/537* | (2006.01) | |
| *H02M 1/00* | (2006.01) | |

(52) U.S. Cl.
CPC ............ *H02M 3/158* (2013.01); *H01L 25/00* (2013.01); *H02M 7/003* (2013.01); *H02M 7/537* (2013.01); *H02M 2001/007* (2013.01)

(58) Field of Classification Search
CPC ...... H02M 3/156; H02M 3/158; H02M 7/003; H01L 25/00; H01L 25/16; H01L 25/162
See application file for complete search history.

(56) References Cited

U.S. PATENT DOCUMENTS

| | | | |
|---|---|---|---|
| 5,321,299 A * | 6/1994 | Ohkawa | H01L 25/16 257/528 |
| 7,436,070 B2 | 10/2008 | Uno et al. | |
| 7,863,756 B2 | 1/2011 | Uno et al. | |
| 7,965,069 B2 * | 6/2011 | Watanabe | H02M 3/158 323/271 |
| 8,076,767 B2 | 12/2011 | Uno et al. | |
| 8,482,345 B2 | 7/2013 | Uno et al. | |
| 9,024,423 B2 | 5/2015 | Muto et al. | |
| 2005/0280490 A1 * | 12/2005 | Uchiyama | H01R 13/2421 336/90 |
| 2007/0195563 A1 * | 8/2007 | Shiraishi | H01L 24/49 363/25 |

(Continued)

FOREIGN PATENT DOCUMENTS

| | | | |
|---|---|---|---|
| JP | H04-054864 A | 2/1992 | |
| JP | H06-351113 A | 12/1994 | |

(Continued)

*Primary Examiner* — Fred E Finch, III
(74) *Attorney, Agent, or Firm* — Manabu Kanesaka

(57) ABSTRACT

In a boost chopper circuit, a distance between a plurality of first mounting portions of a first semiconductor package that houses a switching device circuit and a distance between a plurality of second mounting portions of a second semiconductor package that houses a backflow prevention diode circuit are different from each other.

11 Claims, 5 Drawing Sheets

(56) References Cited

U.S. PATENT DOCUMENTS

| | | | | |
|---|---|---|---|---|
| 2008/0304306 | A1* | 12/2008 | Chang | H01L 25/16 |
| | | | | 363/147 |
| 2009/0251117 | A1* | 10/2009 | Pigott | H02M 3/1584 |
| | | | | 323/272 |
| 2011/0181255 | A1* | 7/2011 | Hashimoto | H02M 3/1588 |
| | | | | 323/272 |
| 2011/0188279 | A1* | 8/2011 | Aiba | H02M 1/00 |
| | | | | 363/141 |
| 2011/0242861 | A1 | 10/2011 | Ayukawa et al. | |
| 2012/0223926 | A1 | 9/2012 | Morii et al. | |
| 2013/0026616 | A1* | 1/2013 | Lee | H01L 23/4334 |
| | | | | 257/675 |
| 2013/0049137 | A1* | 2/2013 | Uno | H01L 27/088 |
| | | | | 257/401 |
| 2014/0346659 | A1* | 11/2014 | Nakamura | H02M 7/003 |
| | | | | 257/704 |
| 2015/0221622 | A1* | 8/2015 | Lopez | H01L 25/16 |
| | | | | 257/676 |
| 2015/0223339 | A1* | 8/2015 | Nakamura | H01L 23/3735 |
| | | | | 361/705 |
| 2016/0247751 | A1* | 8/2016 | Kinzer | H01L 23/49575 |
| 2017/0093285 | A1* | 3/2017 | Sasao | H02M 3/158 |
| 2017/0264194 | A1* | 9/2017 | Hikone | H02M 3/156 |

FOREIGN PATENT DOCUMENTS

| | | |
|---|---|---|
| JP | H09-135589 A | 5/1997 |
| JP | 2005-310907 A | 11/2005 |
| JP | 2006-184456 A | 7/2006 |
| JP | 2010-283236 A | 12/2010 |
| JP | 2011-217427 A | 10/2011 |
| JP | 2013-038921 A | 2/2013 |
| JP | 2015-226438 A | 12/2015 |
| WO | 2011/065051 A1 | 6/2011 |

* cited by examiner

BOOST CHOPPER CIRCUIT INCLUDING SWITCHING DEVICE CIRCUIT AND BACKFLOW PREVENTION DIODE CIRCUIT

CROSS-REFERENCE TO RELATED APPLICATION

The priority application number JP2016-049761, Boost Chopper Circuit, Mar. 14, 2016, Motoyoshi Kubouchi and Hao Hou, upon which this patent application is based, is hereby incorporated by reference.

BACKGROUND OF THE INVENTION

Field of the Invention

The present invention relates to a boost chopper circuit, and more particularly, it relates to a boost chopper circuit including a switching device circuit and a backflow prevention diode circuit.

Description of the Background Art

A boost chopper circuit including a switching device circuit and a backflow prevention diode circuit is known in general, as disclosed in Japanese Patent Laying-Open No. 9-135589.

Japanese Patent Laying-Open No. 9-135589 discloses a speed controller of an induction motor that includes a boost chopper circuit including a switching device and a backflow prevention diode. In this speed controller, a secondary current from the induction motor is rectified by a rectifier circuit, and the rectified current (voltage) is boosted by the boost chopper circuit. This speed controller is provided with a power source, and the boost chopper circuit returns the boosted electric power from the induction motor to the power source. Furthermore, in general, the switching device and the backflow prevention diode of this boost chopper circuit are housed in the same package.

However, in the conventional structure in which the switching device and the backflow prevention diode are housed in the same package, the whole package is replaced even when one of the switching device and the backflow prevention diode fails. Thus, not only the failing device but also the device that is not failing is disadvantageously replaced. Therefore, in the boost chopper circuit described in the aforementioned Japanese Patent Laying-Open No. 9-135589, the switching device (switching device circuit) or the backflow prevention diode (backflow prevention diode circuit) that requires no replacement is disadvantageously replaced.

SUMMARY OF THE INVENTION

The present invention has been proposed in order to solve the aforementioned problem, and an object of the present invention is to provide a boost chopper circuit capable of preventing replacement of a switching device circuit or a backflow prevention diode circuit that requires no replacement.

In order to attain the aforementioned object, a boost chopper circuit according to an aspect of the present invention includes a reactor, a switching device circuit connected to both ends of a direct-current output circuit through the reactor, a backflow prevention diode circuit connected to the switching device circuit, a capacitor circuit connected in series to the backflow prevention diode circuit between both ends of the switching device circuit, a first semiconductor package that houses the switching device circuit, and a second semiconductor package that is provided separately from the first semiconductor package and houses the backflow prevention diode circuit. The first semiconductor package includes a plurality of first mounting portions that detachably mounts the first semiconductor package on a boost chopper circuit body, the second semiconductor package includes a plurality of second mounting portions that detachably mounts the second semiconductor package on the boost chopper circuit body, and a distance between the plurality of first mounting portions and a distance between the plurality of second mounting portions are different from each other. In general, the term "circuit" indicates a system of conductors connected to each other without an end, but in this description, the term "circuit" indicates a wider concept including the case where a "path of a current" has an end.

As hereinabove described, the boost chopper circuit according to this aspect of the present invention includes the first semiconductor package that houses the switching device circuit and the second semiconductor package that is provided separately from the first semiconductor package and houses the backflow prevention diode circuit. Thus, when one of the switching device circuit and the backflow prevention diode circuit fails, only the first semiconductor package that houses the failing switching device circuit or the second semiconductor package that houses the failing backflow prevention diode circuit can be replaced, and hence replacement of the switching device circuit or the backflow prevention diode circuit that requires no replacement can be prevented. In this case, replacement of the switching device circuit or the backflow prevention diode circuit that requires no replacement is prevented, and hence an increase in replacement costs can be prevented. Furthermore, in the first semiconductor package and the second semiconductor package, the distance between the plurality of first mounting portions and the distance between the plurality of second mounting portions are different from each other, whereby the second semiconductor package (first semiconductor package) cannot be mounted on a location on which the first semiconductor package (second semiconductor package) is mounted. Thus, mixing up of the first semiconductor package and the second semiconductor package can be prevented when the first semiconductor package or the second semiconductor package is replaced. In addition, also at the time of manufacturing the boost chopper circuit, mixing up of the first semiconductor package and the second semiconductor package can be prevented when the first semiconductor package and the second semiconductor package are mounted, and hence the productivity (production efficiency) of the boost chopper circuit can be improved.

In the aforementioned boost chopper circuit according to this aspect, the first semiconductor package and the second semiconductor package preferably have different shapes from each other. According to this structure, unlike the case where the first semiconductor package and the second semiconductor package have the same shape as each other, mixing up of the first semiconductor package and the second semiconductor package can be prevented when the first semiconductor package or the second semiconductor package is replaced. Furthermore, also at the time of manufacturing the boost chopper circuit, mixing up of the first semiconductor package and the second semiconductor package can be prevented when the first semiconductor package and the second semiconductor package are mounted, and hence the productivity (production efficiency) of the boost chopper circuit can be improved.

In the aforementioned boost chopper circuit according to this aspect, the backflow prevention diode circuit preferably includes a diode that includes a wide band gap semiconductor. According to this structure, the diode that includes the wide band gap semiconductor is used such that a reverse recovery loss can be reduced as compared with the case where a diode that includes a common silicon semiconductor is used. Consequently, a power loss can be reduced when the boost chopper circuit is driven.

In the aforementioned boost chopper circuit according to this aspect, the switching device circuit preferably includes a switching device that includes a wide band gap semiconductor. According to this structure, the switching device that includes the wide band gap semiconductor is used such that a switching loss can be reduced as compared with the case where a switching device that includes a common silicon semiconductor is used. Consequently, a power loss can be reduced when the boost chopper circuit is driven.

In the aforementioned boost chopper circuit according to this aspect, the switching device circuit preferably includes a first switching device and a second switching device connected in series to each other, the backflow prevention diode circuit preferably includes a first diode connected in series to the first switching device and a second diode connected in series to the second switching device, the capacitor circuit preferably includes a first capacitor and a second capacitor connected in series to each other, the first semiconductor package preferably includes one first semiconductor package that houses the first switching device and the other first semiconductor package that is provided separately from the one first semiconductor package and houses the second switching device, and the second semiconductor package preferably includes one second semiconductor package that houses the first diode and the other second semiconductor package that is provided separately from the one second semiconductor package and houses the second diode. According to this structure, the boost chopper circuit can be configured as a three-level boost chopper circuit, and when any of the first switching device, the second switching device, the first diode, and the second diode fails, replacement of the remaining devices that require no replacement can be prevented.

In the aforementioned boost chopper circuit according to this aspect, the switching device circuit preferably includes a first switching device and a second switching device connected in series to each other, the backflow prevention diode circuit preferably includes a first diode connected in series to the first switching device and a second diode connected in series to the second switching device, the capacitor circuit preferably includes a first capacitor and a second capacitor connected in series to each other, and both the first switching device and the second switching device are preferably housed in the first semiconductor package, or both the first diode and the second diode are preferably housed in the second semiconductor package. The possibility of failure of the first diode and the second diode is conceivably lower than the possibility of failure of the first switching device and the second switching device, which are connected to a control circuit and configured as active devices. Furthermore, when one of the first switching device and the second switching device fails, the other of the first switching device and the second switching device conceivably fails. In view of this point, according to the present invention, both the first switching device and the second switching device are housed in the first semiconductor package, or both the first diode and the second diode are housed in the second semiconductor package. Thus, even when both the first diode and the second diode are housed in the second semiconductor package, the number of times of replacement of the second semiconductor package can be reduced due to the low possibility of failure. Even when both the first switching device and the second switching device are housed in the first semiconductor package, replacement of the switching device that requires no replacement can be prevented due to the high possibility that the first switching device and the second switching device fail simultaneously. Furthermore, the first semiconductor package or the second semiconductor package houses a plurality of devices, whereby an increase in the number of packages can be prevented, and hence an increase in the size (complication) of the boost chopper circuit can be significantly reduced or prevented.

In this case, both the first diode and the second diode are preferably housed in the second semiconductor package. According to this structure, as compared with the case where the first diode and the second diode are housed in separate packages, the number of packages is not increased, and hence an increase in the size (complication) of the boost chopper circuit can be significantly reduced or prevented. Although both the first diode and the second diode are housed in the second semiconductor package, the number of times of replacement of the second semiconductor package can be reduced due to the low possibility that the first diode and the second diode fail.

In the aforementioned boost chopper circuit in which both the first switching device and the second switching device are housed in the first semiconductor package, or both the first diode and the second diode are housed in the second semiconductor package, both the first switching device and the second switching device are preferably housed in the first semiconductor package. According to this structure, as compared with the case where the first switching device and the second switching device are housed in separate packages, the number of packages is not increased, and hence an increase in the size (complication) of the boost chopper circuit can be significantly reduced or prevented. Although both the first switching device and the second switching device are housed in the first semiconductor package, replacement of the switching device that requires no replacement can be prevented due to the high possibility that the first switching device and the second switching device fail simultaneously.

In the aforementioned boost chopper circuit in which both the first switching device and the second switching device are housed in the first semiconductor package, or both the first diode and the second diode are housed in the second semiconductor package, both the first switching device and the second switching device that are likely to fail simultaneously are preferably housed in the first semiconductor package, or both the first diode and the second diode that are less likely to fail than the first switching device and the second switching device are preferably housed in the second semiconductor package. According to this structure, an increase in the number of packages can be prevented while replacement of the switching devices that require no replacement is properly prevented on the basis of the possibility of failure or a failure mode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described with reference to the drawings.

First Embodiment

The structure of a boost chopper circuit 100 according to a first embodiment is now described with reference to FIGS. 1 and 2.

(Structure of Boost Chopper Circuit)

Figure 1:
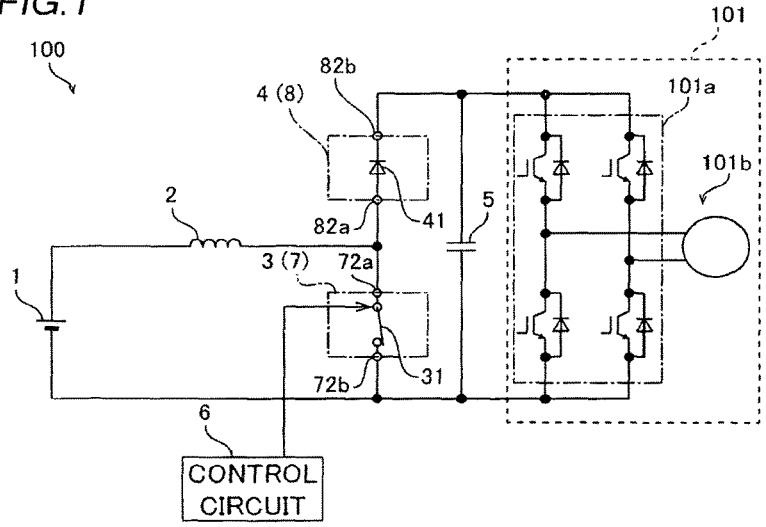
FIG. 1 is an electrical diagram showing the overall structure of a boost chopper circuit according to a first embodiment of the present invention.

As shown in FIG. 1, the boost chopper circuit 100 is configured to boost a voltage output from a direct-current output circuit 1 and supply the boosted voltage to a loading device 101. According to the first embodiment, the boost chopper circuit 100 is configured as a so-called two-level boost chopper circuit. The direct-current output circuit 1 is configured as a direct-current power source, or includes an alternating-current power source and a rectifier circuit and is configured to output electric power having a rectification waveform obtained by rectifying an alternate current so as to output a direct current.

The boost chopper circuit 100 includes a reactor 2, a switching device circuit 3, a backflow prevention diode circuit 4, a capacitor 5, and a control circuit 6. In general, the term "circuit" indicates a system of conductors connected to each other without an end, but in this description, the term "circuit" indicates a wider concept including the case where a "path of a current" has an end.

According to the first embodiment, the switching device circuit 3 is connected to both ends of the direct-current output circuit 1 through the reactor 2, as shown in FIG. 1. The switching device circuit 3 includes a switching device 31. Specifically, a first end of the reactor 2 is connected to a positive pole of the direct-current output circuit 1, and a second end of the reactor 2 is connected to a first end of the switching device circuit 3 (switching device 31). A second end of the switching device circuit 3 (switching device 31) is connected to a negative pole of the direct-current output circuit 1.

According to the first embodiment, the switching device 31 includes a wide band gap semiconductor. Specifically, the switching device 31 includes a semiconductor device, the band gap of which is larger (wider) than that of a silicon semiconductor such as SiC, GaN, diamond, AlN, or ZnO. The switching device 31 is configured as a switching device such as a MOSFET, an IGBT (insulated gate bipolar transistor), or a transistor.

The backflow prevention diode circuit 4 is connected to the switching device circuit 3. Specifically, the backflow prevention diode circuit 4 includes a diode 41. The diode 41 includes a wide band gap semiconductor. Specifically, the diode 41 may include the same type of wide band gap semiconductor as the switching device 31 or a different type of wide band gap semiconductor from the switching device 31. A first end (an anode of the diode 41) of the backflow prevention diode circuit 4 is connected to the second end of the reactor 2 and the first end of the switching device circuit 3, and a second end (a cathode of the diode 41) of the backflow prevention diode circuit 4 is connected to a first end of the capacitor 5.

A second end of the capacitor 5 is connected to the second end of the switching device circuit 3 and the negative pole of the direct-current output circuit 1. More specifically, according to the first embodiment, the capacitor 5 is connected in series to the backflow prevention diode circuit 4 between both ends of the switching device circuit 3.

The control circuit 6 is connected to the switching device circuit 3, and is configured to control a time ratio of turning on and turning off (switching operation) of the switching device 31 of the switching device circuit 3. The control circuit 6 is configured to be capable of adjusting (controlling) a voltage value (voltage boosting) and a current value (a value of a current that flows in the reactor 2) of the boost chopper circuit 100 with respect to the loading device 101 by controlling the time ratio of turning on and turning off of the switching device circuit 3.

The loading device 101 includes an inverter 101a including a plurality of switching devices and an electric motor 101b, for example. The inverter 101a is connected to both ends of the capacitor 5, and is configured to convert direct-current power with a voltage boosted by the boost chopper circuit 100 to alternating-current power and supply the alternating-current power to the electric motor 101b. The electric motor 101b is configured as a rotating electrical machine, for example, and is configured to consume the alternating-current power from the inverter 101a to be rotationally driven.

<Structures of First Semiconductor Package and Second Semiconductor Package>

Figure 2:
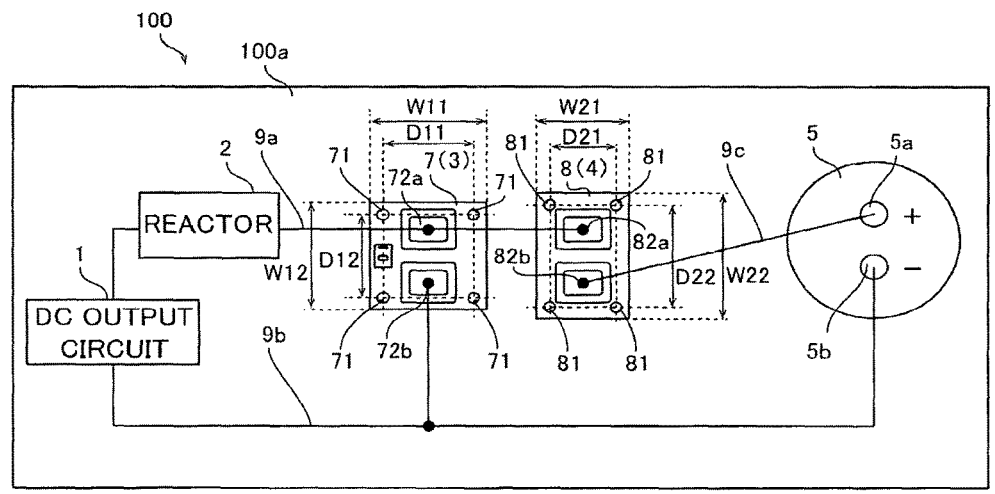
FIG. 2 is a plan view schematically showing the structure of the boost chopper circuit according to the first embodiment of the present invention.

According to the first embodiment, the boost chopper circuit 100 includes a first semiconductor package 7 and a second semiconductor package 8, as shown in FIG. 2. Specifically, the boost chopper circuit 100 includes a boost chopper circuit body 100a. The boost chopper circuit body 100a may be configured as a printed circuit board or a heatsink, for example. In an example shown in FIG. 2, the boost chopper circuit body 100a is illustrated as a single member, but the boost chopper circuit body 100a is not restricted to a single printed circuit board or heatsink. The boost chopper circuit body 100a may include a plurality of printed circuit boards or a plurality of heatsinks (or a combination of these).

According to the first embodiment, the first semiconductor package 7 houses the switching device circuit 3. Specifically, the first semiconductor package 7 is obtained by mounting the switching device circuit 3 on a base of metal such as copper through an insulating layer and covering it with a resin case after wiring, for example. According to the first embodiment, the first semiconductor package 7 houses the switching device 31 that the switching device circuit 3 includes.

As shown in FIG. 2, the first semiconductor package 7 includes a plurality of mounting portions 71, a first terminal 72a, and a second terminal 72b. Specifically, the first semiconductor package 7 includes the plurality of mounting portions 71 that detachably mounts the first semiconductor package 7 on the boost chopper circuit body 100a. The mounting portions 71 are configured as through-holes in which unshown fixing members such as screws can be arranged, for example. Thus, the first semiconductor package 7 is detachable from the boost chopper circuit body 100a (is replaceable).

The boost chopper circuit 100 includes wires 9a to 9c, and the first terminal 72a is connected to the wire 9a that is connected to the second end of the reactor 2. The second terminal 72b is connected to the wire 9b that is connected to the negative pole of the direct-current output circuit 1. A conductor (such as a solder) may be welded to a connection portion between the first terminal 72a and the wire 9a and a connection portion between the second terminal 72b and the wire 9b so that the first terminal 72a is bonded to the wire 9a and the second terminal 72b is bonded to the wire 9b, or bolts or the like made of metal may be screwed into nuts provided inside the first terminal 72a and the second terminal 72b such that the wires 91 and 9b are sandwiched between the nuts and the bolts, for example. The term "wire" is used, but it is not restricted to a cable-like (linear) member. A wiring plate may be used.

According to the first embodiment, the boost chopper circuit 100 includes the second semiconductor package 8 that is provided separately from the first semiconductor package 7 and houses the backflow prevention diode circuit 4. Specifically, the second semiconductor package 8 internally houses the diode 41 spaced apart from the first semiconductor package 7, which the backflow prevention diode circuit 4 includes.

According to the first embodiment, the first semiconductor package 7 and the second semiconductor package 8 have different shapes from each other. Specifically, the widths (W11 and W21) of the first semiconductor package 7 and the second semiconductor package 8 in a direction parallel to an X-axis and the widths (W12 and W22) of the first semiconductor package 7 and the second semiconductor package 8 in a direction parallel to a Y-axis are different from each other in a plan view (as viewed from a Z1 direction side), as shown in FIG. 2.

More specifically, the first semiconductor package 7 has a rectangular shape in a plan view. The first semiconductor package 7 has the width W11 in the direction parallel to the X-axis and the width W12 in the direction parallel to the Y-axis, for example. The second semiconductor package 8 has a rectangular shape in a plan view. The second semiconductor package 8 has the width W21 that is smaller than the width W11 in the direction parallel to the X-axis and the width W22 that is larger than the width W12 in the direction parallel to the Y-axis, for example.

The second semiconductor package 8 includes a plurality of mounting portions 81, a first terminal 82a, and a second terminal 82b. Specifically, the second semiconductor package 8 includes the plurality of mounting portions 81 that detachably mounts the second semiconductor package 8 on the boost chopper circuit body 100a. The mounting portions 81 are configured similarly to the mounting portions 71, and the second semiconductor package 8 is detachable from the boost chopper circuit body 100a (is replaceable) by the mounting portions 81. The first terminal 82a is connected to the wire 9a. Therefore, the first terminal 82a of the second semiconductor package 8, the first terminal 72a of the first semiconductor package 7, and the second end of the reactor 2 are connected to each other through the wire 9a. The second terminal 82b is connected to the wire 9c.

According to the first embodiment, in the first semiconductor package 7 and the second semiconductor package 8, a distance D11 between the plurality of mounting portions 71 and a distance D21 between the plurality of mounting portions 81 are different from each other in the direction parallel to the X-axis. Furthermore, in the first semiconductor package 7 and the second semiconductor package 8, a distance D12 between the plurality of mounting portions 71 and a distance D22 between the plurality of mounting portions 81 are different from each other in the direction parallel to the Y-axis.

According to the first embodiment, the first semiconductor package 7 and the second semiconductor package 8 are replaceable individually from the boost chopper circuit 100 (boost chopper circuit body 100a).

The capacitor 5 includes a first terminal 5a and a second terminal 5b, as shown in FIG. 2. The first terminal 5a is connected to the wire 9c, and the second terminal 5b is connected to the wire 9b. In other words, the capacitor 5 is connected to the second terminal 82b of the second semiconductor package 8 through the wire 9c, and is connected to the negative pole of the direct-current output circuit 1 through the wire 9b. Thus, the capacitor 5 is connected in series to the backflow prevention diode circuit 4 between both ends of the switching device circuit 3.

(Operation of Boost Chopper Circuit)

The operation of the boost chopper circuit 100 according to the first embodiment is now described with reference to FIG. 1. The operation of the boost chopper circuit 100 is performed by control processing of the control circuit 6.

When the switching device 31 is turned off, a series resonant circuit of the direct-current output circuit 1, the reactor 2, and the capacitor 5 is formed, and the voltage of the capacitor 5 rises. In this case, the voltage of the capacitor 5 is applied to the switching device 31. The diode 41 conducts, and no voltage is applied thereto.

When the switching device 31 is turned on, the direct-current output circuit 1 short-circuits through the reactor 2, and no current flows into the capacitor 5. In this case, the voltage of the capacitor 5 is applied to the diode 41. A current flows from the capacitor 5 to the subsequent loading device 101 so that the voltage of the capacitor 5 drops.

During steady operation, the switching device 31 is switched on and off at a fixed time ratio, the amount of rise in the voltage of the capacitor 5 in the case where the switching device 31 is switched off balances the amount of drop in the voltage of the capacitor 5 in the case where the switching device 31 is switched on, and the output voltage becomes a substantially constant and boosted direct-current voltage that is equal to or more than an input power supply voltage.

When the device (loading device 101) stops, the switching device 31 is turned off. Furthermore, the switches of the inverter 101a are turned off, and no current flows to the loading device 101. In this case, the direct-current output circuit 1, the reactor 2, and the capacitor 5 form a series resonant circuit.

In this case, the voltage of the capacitor 5 rises. The switching device 31 is not on (is off), and hence the voltage of the capacitor 5 is raised above that during steady operation. When a resonant current reaches zero, the discharge of the capacitor 5 is prevented by the diode 41 and the switching device 31 that is off. Whereas the voltage of the switching device 31 is equal to the voltage of the capacitor 5 during the time when the capacitor 5 is charged, the voltage of the switching device 31 becomes equal to the voltage of the direct-current output circuit 1 when the resonant current reaches zero. Whereas a relatively low voltage is applied to the diode 41 during the time when the capacitor 5 is charged, a voltage obtained by subtracting the voltage of the switching device 31 (the voltage of the direct-current output circuit 1) from the voltage of the capacitor 5 is applied to the diode 41 when the resonant current reaches zero.

In the boost chopper circuit 100 that performs the above operation, the switching device 31 can fail. Even when the switching device 31 fails, the diode 41 may not fail. In this case, in the boost chopper circuit 100, the second semiconductor package 8 is not replaced, but only the first semiconductor package 7 that houses the failing switching device 31 is replaced. In this case, when the diode 41 includes the wide band gap semiconductor, an effect of preventing an increase in replacement costs becomes prominent, as described below.

Furthermore, in the boost chopper circuit 100 that performs the above operation, the diode 41 can fail when reverse recovery surge occurs. Even when the diode 41 fails, the switching device 31 may not fail. When the switching device 31 is turned off by the control circuit 6 before a value of a current that flows in the switching device 31 exceeds a short circuit resistance, for example, the switching device 31 does not fail. In this case, in the boost chopper circuit 100, the first semiconductor package 7 is not replaced, but only the second semiconductor package 8 that houses the failing diode 41 is replaced. In this case, when the switching device 31 includes the wide band gap semiconductor, an effect of preventing an increase in replacement costs becomes prominent, as described below.

Effects of First Embodiment

According to the first embodiment, the following effects can be obtained.

According to the first embodiment, as hereinabove described, the boost chopper circuit 100 includes the first semiconductor package 7 that houses the switching device circuit 3 and the second semiconductor package 8 that is provided separately from the first semiconductor package 7 and houses the backflow prevention diode circuit 4. Thus, when one of the switching device circuit 3 and the backflow prevention diode circuit 4 fails, only the first semiconductor package 7 that houses the failing switching device circuit 3 or the second semiconductor package 8 that houses the failing backflow prevention diode circuit 4 can be replaced, and hence replacement of the switching device circuit 3 or the backflow prevention diode circuit 4 that requires no replacement can be prevented. Replacement of the switching device circuit 3 or the backflow prevention diode circuit 4 that requires no replacement is prevented, and hence an increase in replacement costs can be prevented.

According to the first embodiment, as hereinabove described, the first semiconductor package 7 includes the plurality of mounting portions 71 that detachably mounts the first semiconductor package 7 on the boost chopper circuit body 100a. The second semiconductor package 8 includes the plurality of mounting portions 81 that detachably mounts the second semiconductor package 8 on the boost chopper circuit body 100a. In the first semiconductor package 7 and the second semiconductor package 8, the distances between the plurality of mounting portions 71 and the distances between the plurality of mounting portions 81 are different from each other. Thus, the second semiconductor package 8 (first semiconductor package 7) cannot be mounted on a location on which the first semiconductor package 7 (second semiconductor package 8) is mounted. Thus, mixing up of the first semiconductor package 7 and the second semiconductor package 8 can be prevented when the first semiconductor package 7 or the second semiconductor package 8 is replaced. Furthermore, also at the time of manufacturing the boost chopper circuit 100, mixing up of the first semiconductor package 7 and the second semiconductor package 8 can be prevented when the first semiconductor package 7 and the second semiconductor package 8 are mounted, and hence the productivity (production efficiency) of the boost chopper circuit 100 can be improved.

According to the first embodiment, as hereinabove described, the first semiconductor package 7 and the second semiconductor package 8 have the different shapes from each other. Thus, unlike the case where the first semiconductor package 7 and the second semiconductor package 8 have the same shape as each other, mixing up of the first semiconductor package 7 and the second semiconductor package 8 can be prevented when the first semiconductor package 7 or the second semiconductor package 8 is replaced. Furthermore, also at the time of manufacturing the boost chopper circuit 100, mixing up of the first semiconductor package 7 and the second semiconductor package 8 can be prevented when the first semiconductor package 7 and the second semiconductor package 8 are mounted, and hence the productivity (production efficiency) of the boost chopper circuit 100 can be improved.

According to the first embodiment, as hereinabove described, the backflow prevention diode circuit 4 includes the diode 41 that includes the wide band gap semiconductor. Thus, the diode 41 that includes the wide band gap semiconductor is used such that a reverse recovery loss can be reduced as compared with the case where a diode that includes a common silicon semiconductor is used. Consequently, a power loss can be reduced when the boost chopper circuit 100 is driven.

According to the first embodiment, as hereinabove described, the switching device circuit 3 includes the switching device 31 that includes the wide band gap semiconductor. Thus, the switching device 31 that includes the wide band gap semiconductor is used such that a switching loss can be reduced as compared with the case where a switching device that includes a common silicon semiconductor is used. Consequently, a power loss can be reduced when the boost chopper circuit 100 is driven.

Second Embodiment

The structure of a boost chopper circuit 200 according to a second embodiment is now described with reference to FIGS. 3 and 4. In the second embodiment, the boost chopper circuit 200 is configured as a three-level boost chopper circuit unlike the boost chopper circuit 100 configured as the two-level boost chopper circuit. Portions of the boost chopper circuit 200 similar to those of the boost chopper circuit 100 according to the aforementioned first embodiment are denoted by the same reference numerals, to omit the description.

(Structure of Boost Chopper Circuit According to Second Embodiment)

Figure 3:
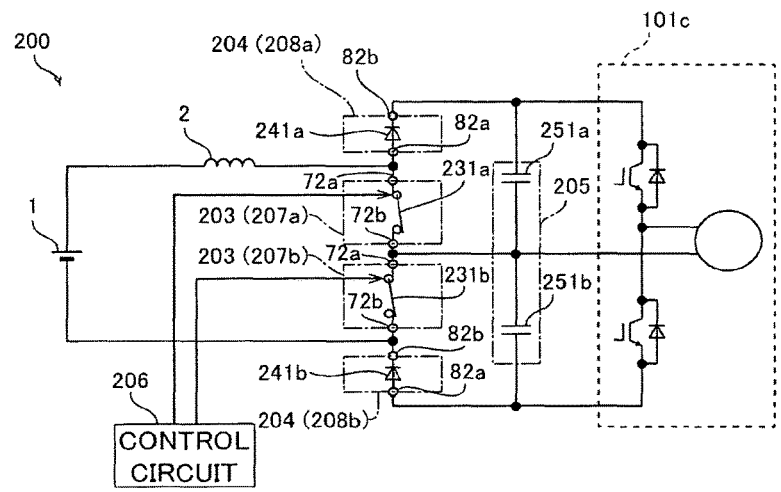
FIG. 3 is an electrical diagram showing the overall structure of a boost chopper circuit according to a second embodiment of the present invention.
Figure 4:
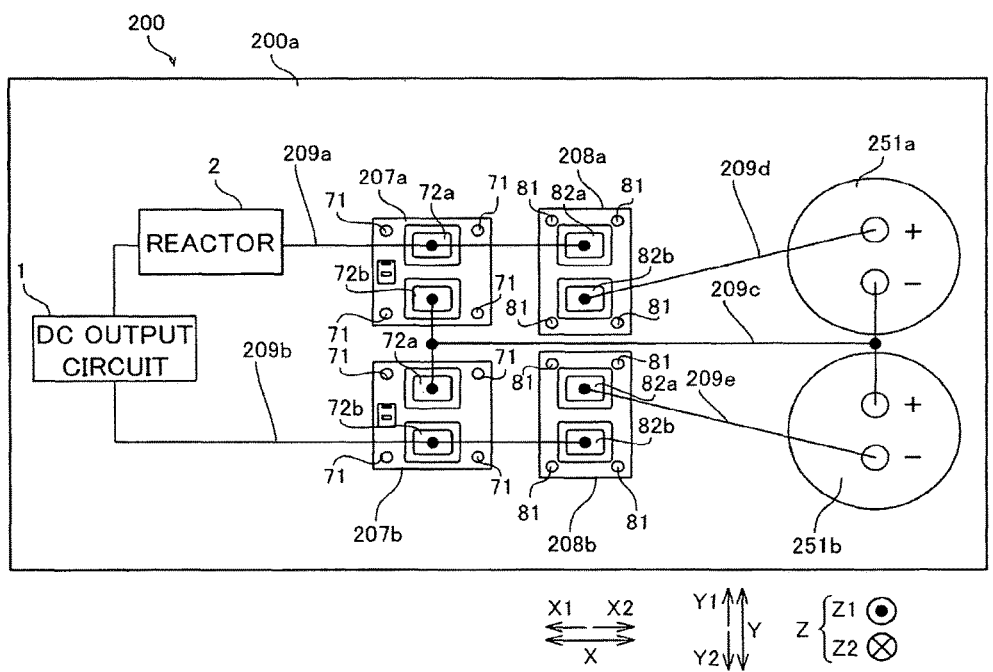
FIG. 4 is a plan view schematically showing the structure of the boost chopper circuit according to the second embodiment of the present invention.

As shown in FIGS. 3 and 4, the boost chopper circuit 200 according to the second embodiment includes a switching device circuit 203, a backflow prevention diode circuit 204, a capacitor circuit 205, and a control circuit 206. The boost chopper circuit 200 is configured as the three-level boost chopper circuit.

The boost chopper circuit 200 includes first semiconductor packages 207a and 207b and second semiconductor packages 208a and 208b.

As shown in FIG. 3, the switching device circuit 203 includes a first switching device 231a and a second switching device 231b connected in series to each other. The backflow prevention diode circuit 204 includes a first diode 241a connected in series to the first switching device 231a and a second diode 241b connected in series to the second switching device 231b. The capacitor circuit 205 includes a first capacitor 251a and a second capacitor 251b connected in series to each other.

The first semiconductor package 207a houses the first switching device 231a. The first semiconductor package 207b is provided separately from the first semiconductor package 207a and houses the second switching device 231b.

The second semiconductor package 208a houses the first diode 241a. The second semiconductor package 208b is provided separately from the second semiconductor package 208a and houses the second diode 241b.

In other words, according to the second embodiment, the first switching device 231a, the second switching device 231b, the first diode 241a, and the second diode 241b are housed in the separate packages.

<Structures of First Semiconductor Package and Second Semiconductor Package>

As shown in FIG. 4, the first semiconductor packages 207a and 207b have substantially the same shape as each other. The second semiconductor packages 208a and 208b have substantially the same shape as each other. The first semiconductor package 207a and the second semiconductor package 208a have different shapes from each other. For example, the first semiconductor packages 207a and 207b have the same shape as that of the first semiconductor package 7 according to the first embodiment. The second semiconductor packages 208a and 208b have the same shape as that of the second semiconductor package 8 according to the first embodiment.

The boost chopper circuit 200 includes a boost chopper circuit body 200a, and the first semiconductor packages 207a and 207b and the second semiconductor packages 208a and 208b are individually mounted on the boost chopper circuit body 200a. The first semiconductor packages 207a and 207b and the second semiconductor packages 208a and 208b are spaced apart from each other. The first semiconductor packages 207a and 207b and the second semiconductor packages 208a and 208b are replaceable (detachable) individually from the boost chopper circuit body 200a.

The boost chopper circuit 200 includes wires 209a to 209e. The wire 209a is connected with a reactor 2, the first semiconductor package 207a, and the second semiconductor package 208a. The wire 209b is connected with a direct-current output circuit 1, the first semiconductor package 207b, and the second semiconductor package 208b. The wire 209c is connected with the first semiconductor package 207a, the first semiconductor package 207b, the first capacitor 251a, and the second capacitor 251b. The wire 209d is connected with the second semiconductor package 208a and the first capacitor 251a. The wire 209e is connected with the second semiconductor package 208b and the second capacitor 251b.

The remaining structures of the boost chopper circuit 200 according to the second embodiment are similar to those of the boost chopper circuit 100 according to the first embodiment.

(Operation of Boost Chopper Circuit According to Second Embodiment)

The operation of the boost chopper circuit 200 according to the second embodiment is now described with reference to FIG. 3. The operation of the boost chopper circuit 200 is performed by control processing of the control circuit 206.

When the first switching device 231a is turned on and the second switching device 231b is turned off, a series resonant circuit of the direct-current output circuit 1, the reactor 2, and the second capacitor 251b is formed, and the voltage of the second capacitor 251b rises. In this case, the voltage of the second capacitor 251b is applied to the second switching device 231b. The second diode 241b conducts, and no voltage is applied thereto. The voltage of the first capacitor 251a into which no current flows from the direct-current output circuit 1 is applied to the first diode 241a.

When the first switching device 231a is turned off and the second switching device 231b is turned on, the direct-current output circuit 1 charges the first capacitor 251a, and the voltage of the first capacitor 251a is applied to the first switching device 231a, which is off.

When both the first switching device 231a and the second switching device 231b are turned on, the direct-current output circuit 1 short-circuits through the reactor 2, and no current flows from the direct-current output circuit 1 into the first capacitor 251a and the second capacitor 251b. The voltages of the first capacitor 251a and the second capacitor 251b are applied to the first diode 241a and the second diode 241b, respectively. A current flows from the first capacitor 251a and the second capacitor 251b to a subsequent loading device 101c (in FIG. 3, the loading device 101c is illustrated as a half-bridge single-phase inverter, but it is not restricted to this) so that the voltages of the first capacitor 251a and the second capacitor 251b drop.

When both the first switching device 231a and the second switching device 231b are turned off, the first capacitor 251a and the second capacitor 251b are charged by current from the direct-current output circuit 1. The voltages of the first capacitor 251a and the second capacitor 251b are applied to the first switching device 231a and the second switching device 231b, respectively.

During steady operation, the first switching device 231a and the second switching device 231b are switched on and off at a fixed time ratio, the amount of rise in the voltages of the first capacitor 251a and the second capacitor 251b in the case where the first switching device 231a and the second switching device 231b are switched off balances the amount of drop in the voltages of the first capacitor 251a and the second capacitor 251b in the case where the first switching device 231a and the second switching device 231b are switched on, and a substantially constant direct-current voltage is obtained.

When the device (loading device 101c) stops, both the first switching device 231a and the second switching device 231b are turned off. Furthermore, the subsequent loading device 101c (switches of the inverter) is turned off, and no current flows to the loading device 101c. In this case, the direct-current output circuit 1, the reactor 2, the first capacitor 251a, and the second capacitor 251b form a series resonant circuit, and the voltages of the first capacitor 251a and the second capacitor 251b rise. Both the first switching device 231a and the second switching device 231b are not turned on (in an off-state), and hence the voltages of the first capacitor 251a and the second capacitor 251b are raised above those during steady operation. In this case, the withstanding voltages of the first capacitor 251a and the second capacitor 251b are higher than the raised voltages.

When a resonant current reaches zero, the discharge of the first capacitor 251a and the second capacitor 251b is prevented by the first diode 241a, the second diode 241b, and the first switching device 231a and the second switching device 231b, which are off. Whereas the voltages of the first switching device 231a and the second switching device 231b are equal to the voltage of the first capacitor 251a or the second capacitor 251b during the time when the capacitor circuit 205 is charged, the voltages of the first switching device 231a and the second switching device 231b become equal to a half of the voltage of the direct-current output circuit 1 when the resonant current reaches zero. Although the first diode 241a and the second diode 241b have no voltage during the time when the first capacitor 251a and the second capacitor 251b are charged (the potential difference is substantially zero), a voltage obtained by subtracting the voltages of the first switching device 231a and the second switching device 231b (a half of the voltage of the direct-current output circuit 1) from the voltages of the first capacitor 251a and the second capacitor 251b is applied to the first diode 241a and the second diode 241b.

In the boost chopper circuit 200 that performs the above operation, one (first switching device 231a, for example) of the first switching device 231a and the second switching device 231b can fail. In this case, the other (second switching device 231b) of the first switching device 231a and the second switching device 231b, the first diode 241a, and the second diode 241b may not fail. In this case, in the boost chopper circuit 200, the first semiconductor package 207b and the second semiconductor packages 208a and 208b are not replaced, but only the first semiconductor package 207a that houses the failing first switching device 231a is replaced.

Furthermore, in the boost chopper circuit 200 that performs the above operation, one (first diode 241a, for example) of the first diode 241a and the second diode 241b can fail when reverse recovery surge occurs. In this case, only the second semiconductor package 208a that houses the failing first diode 241a is replaced.

Effects of Second Embodiment

According to the second embodiment, the following effects can be obtained.

According to the second embodiment, as hereinabove described, the switching device circuit 203 includes the first switching device 231a and the second switching device 231b connected in series to each other. The backflow prevention diode circuit 204 includes the first diode 241a connected in series to the first switching device 231a and the second diode 241b connected in series to the second switching device 231b. The capacitor circuit 205 includes the first capacitor 251a and the second capacitor 251b connected in series to each other. The boost chopper circuit 200 includes the first semiconductor package 207a that houses the first switching device 231a and the first semiconductor package 207b that is provided separately from the first semiconductor package 207a and houses the second switching device 231b. Furthermore, the boost chopper circuit 200 includes the second semiconductor package 208a that houses the first diode 241a and the second semiconductor package 208b that is provided separately from the second semiconductor package 208a and houses the second diode 241b. Thus, the boost chopper circuit 200 can be configured as the three-level boost chopper circuit, and when any of the first switching device 231a, the second switching device 231b, the first diode 241a, and the second diode 241b fails, replacement of the remaining devices that require no replacement can be prevented.

The remaining effects of the boost chopper circuit 200 according to the second embodiment are similar to those of the boost chopper circuit 100 according to the first embodiment.

Third Embodiment

The structure of a boost chopper circuit 300 according to a third embodiment is now described with reference to FIGS. 5 and 6. In the third embodiment, the boost chopper circuit 300 is configured as a three-level boost chopper circuit similarly to the second embodiment. On the other hand, in the third embodiment, both a first diode 341a and a second diode 341b are housed in a second semiconductor package 308 unlike the second embodiment in which the first diode 241a and the second diode 241b are housed in the separate semiconductor packages. Portions of the boost chopper circuit 300 similar to those of the boost chopper circuits 100 and 200 according to the aforementioned first and second embodiments are denoted by the same reference numerals, to omit the description.

(Structure of Boost Chopper Circuit According to Third Embodiment)

Figure 5:
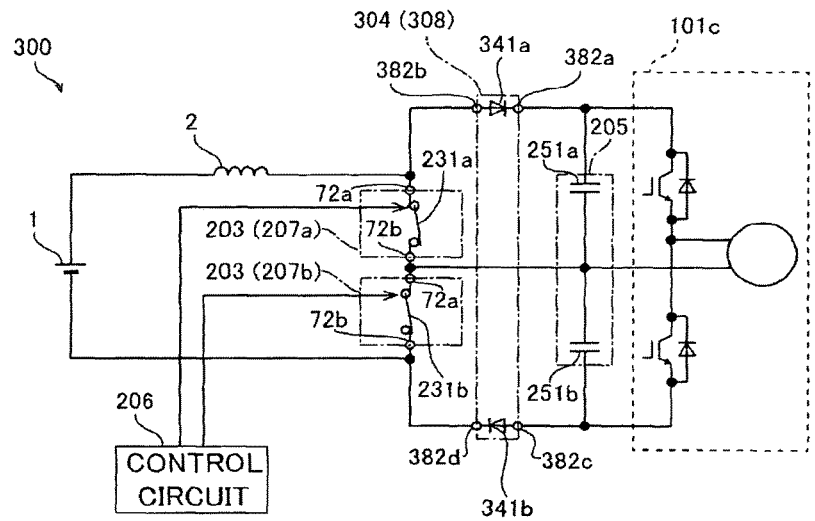
FIG. 5 is an electrical diagram showing the overall structure of a boost chopper circuit according to a third embodiment of the present invention.
Figure 6:
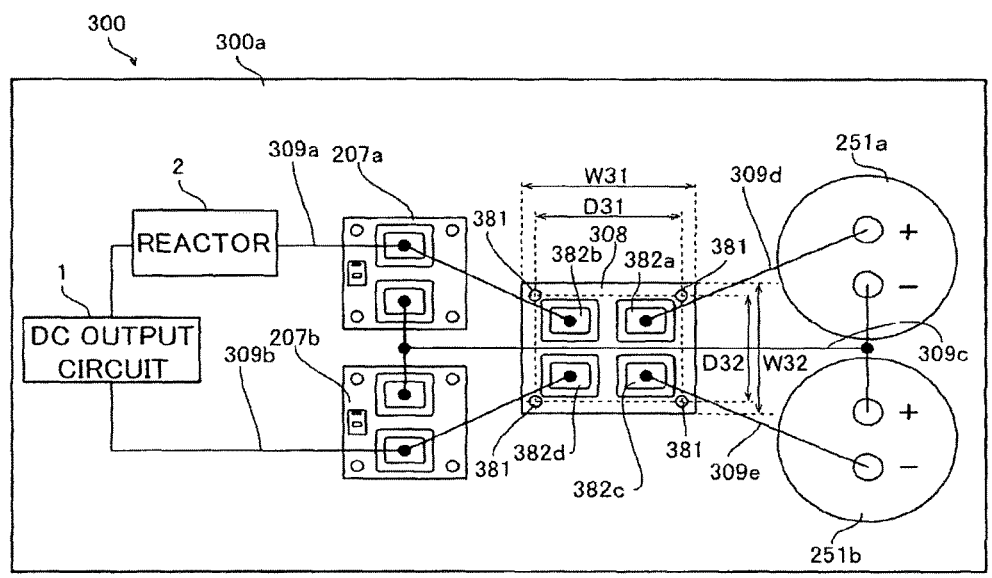
FIG. 6 is a plan view schematically showing the structure of the boost chopper circuit according to the third embodiment of the present invention.

As shown in FIGS. 5 and 6, the boost chopper circuit 300 according to the third embodiment includes first semiconductor packages 207a and 207b and the second semiconductor package 308. The second semiconductor package 308 houses both the first diode 341a and the second diode 341b (backflow prevention diode circuit 304). The second semiconductor package 308 is replaceably mounted on a boost chopper circuit body 300a.

According to the third embodiment, in the first semiconductor packages 207a and 207b and the second semiconductor package 308, distances D11 (see FIG. 2) between pluralities of mounting portions 71 and a distance D31 between a plurality of mounting portions 381 are different from each other in a direction parallel to an X-axis. Furthermore, in the first semiconductor packages 207a and 207b and the second semiconductor package 308, distances D12 (see FIG. 2) between the pluralities of mounting portions 71 and a distance D32 between the plurality of mounting portions 381 are different from each other in a direction parallel to a Y-axis.

The possibility of failure of the first diode 341a and the second diode 341b (passive devices) is conceivably lower than the possibility of failure of the first switching device 231a and the second switching device 231b that are connected to the control circuit 206 and function as active devices. In other words, the frequency of replacement of the first diode 341a and the second diode 341b is conceivably smaller than the frequency of replacement of the first switching device 231a and the second switching device 231b.

According to the third embodiment, both the first diode 341a and the second diode 341b are housed in the second semiconductor package 308 on the basis of the above possibility of failure of the first diode 341a and the second diode 341b.

As shown in FIG. 6, also according to the third embodiment, the first semiconductor packages 207a and 207b and the second semiconductor package 308 are separate from each other, and have different shapes from each other. The second semiconductor package 308 includes the mounting portions 381 and terminals 382a to 382d. The second semiconductor package 308 is mounted on the boost chopper circuit body 300a by the mounting portions 381. The terminals 382a and 382b are connected to the first diode 341a (see FIG. 5), and the terminals 382c and 382d are connected to the second diode 341b (see FIG. 5). The boost chopper circuit 300 includes wires 309a to 309e, and a circuit configuration shown in FIG. 5 is formed by connections of the wires 309a to 309e.

The remaining structures of the boost chopper circuit 300 according to the third embodiment are similar to those of the boost chopper circuit 200 according to the second embodiment. The operation of the boost chopper circuit 300 according to the third embodiment is similar to the operation of the boost chopper circuit body 200a according to the second embodiment.

Effects of Third Embodiment

According to the third embodiment, the following effects can be obtained.

According to the third embodiment, as hereinabove described, both the first diode 341a and the second diode 341b are housed in the second semiconductor package 308. The possibility of failure of the first diode 341a and the second diode 341b is conceivably lower than the possibility of failure of the first switching device 231a and the second switching device 231b, which are connected to the control circuit 206 and configured as active devices. In view of this point, according to the third embodiment, even when both the first diode 341a and the second diode 341b are housed in the second semiconductor package 308, the number of times of replacement of the second semiconductor package 308 can be reduced due to the low possibility of failure. Furthermore, as compared with the case where the first diode 341a and the second diode 341b are housed in separate packages, the number of packages is not increased, and hence an increase in the size (complication) of the boost chopper circuit 300 can be significantly reduced or prevented.

According to the third embodiment, as hereinabove described, both the first diode 341a and the second diode 341b are housed in the second semiconductor package 308 on the basis of at least one (the possibility of failure) of the possibility of failure of the first diode 341a and the second diode 341b and a failure mode. Thus, an increase in the number of packages can be prevented while replacement of the switching devices that require no replacement is properly prevented on the basis of at least one of the possibility of failure and the failure mode.

The remaining effects of the boost chopper circuit 300 according to the third embodiment are similar to those of the boost chopper circuit 100 according to the first embodiment.

Fourth Embodiment

The structure of a boost chopper circuit 400 according to a fourth embodiment is now described with reference to FIGS. 7 and 8. In the fourth embodiment, the boost chopper circuit 400 is configured as a three-level boost chopper circuit similarly to the second embodiment. On the other hand, in the fourth embodiment, both a first switching device 431a and a second switching device 431b are housed in a first semiconductor package 407 unlike the second embodiment in which the first switching device 231a and the second switching device 231b are housed in the separate semiconductor packages. Portions of the boost chopper circuit 400 similar to those of the boost chopper circuits 100 to 300 according to the aforementioned first to third embodiments are denoted by the same reference numerals, to omit the description.

(Structure of Boost Chopper Circuit According to Fourth Embodiment)

Figure 7:
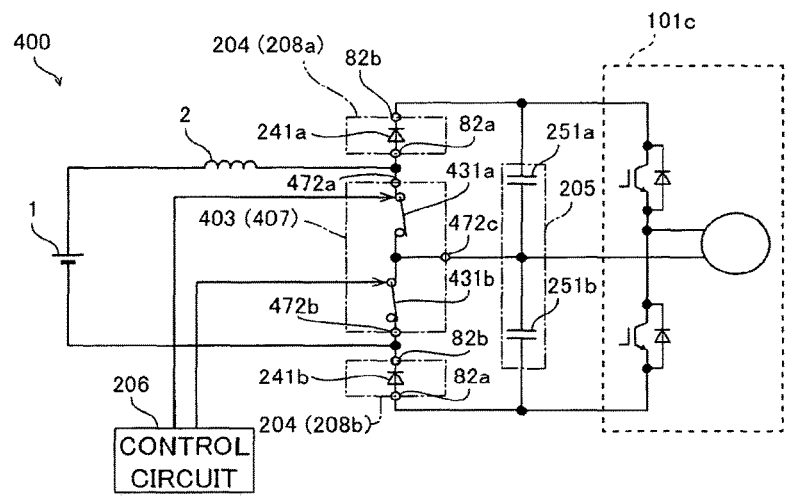
FIG. 7 is an electrical diagram showing the overall structure of a boost chopper circuit according to a fourth embodiment of the present invention.
Figure 8:
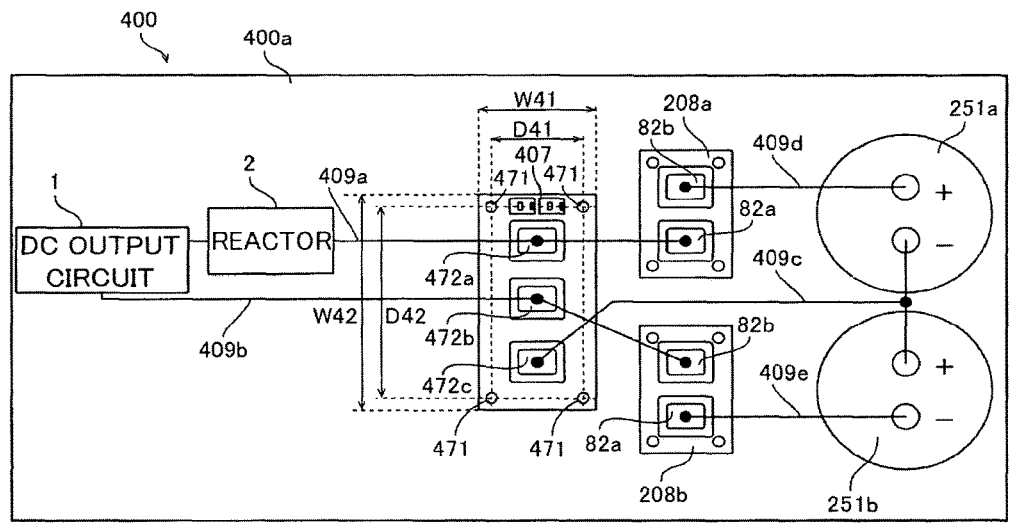
FIG. 8 is a plan view schematically showing the structure of the boost chopper circuit according to the fourth embodiment of the present invention.

The boost chopper circuit 400 according to the fourth embodiment includes the first semiconductor package 407 and second semiconductor packages 208a and 208b, as shown in FIGS. 7 and 8. Both the first switching device 431a and the second switching device 431b (switching device circuit 403) are housed in the first semiconductor package 407. The first semiconductor package 407 is replaceably mounted on a boost chopper circuit body 400a.

According to the fourth embodiment, in the first semiconductor package 407 and the second semiconductor packages 208a and 208b, distances D41 between a plurality of mounting portions 471 and distances D21 (see FIG. 2) between pluralities of mounting portions 81 are different from each other in a direction parallel to an X-axis. Furthermore, in the first semiconductor package 407 and the second semiconductor packages 208a and 208b, distances D42 between the plurality of mounting portions 471 and distances D22 (see FIG. 2) between the pluralities of mounting portions 81 are different from each other in a direction parallel to a Y-axis.

When one (the first switching device 431a, for example) of the first switching device 431a and the second switching device 431b has a short-circuit fault in the boost chopper circuit 400, the other (the second switching device 431b) of the first switching device 431a and the second switching device 431b and switches of an inverter of a loading device 101c are turned off so that a series resonant circuit of a direct-current output circuit 1, a reactor 2, and a second capacitor 251b is formed. In this case, the voltage of the second capacitor 251b is much raised above that within a normal operation range and that in the case where the device (the operation of the boost chopper circuit 400) normally stops.

In this case, when the voltage of the second capacitor 251b rises, a voltage that is equal to this voltage is applied to the second switching device 431b. Thus, the voltage of the second switching device 431b can rise until it reaches the withstanding voltage of the second switching device 431b depending on an input voltage and/or an output voltage during operation. In this case, the second switching device 431b is subject to breakdown and/or withstand breakdown. In other words, when one of the first switching device 431a and the second switching device 431b fails, the other of the first switching device 431a and the second switching device 431b also fails.

According to the fourth embodiment, both the first switching device 431a and the second switching device 431b are housed in the first semiconductor package 407 in response to the above failure mode in which there is a high possibility that both the first switching device 431a and the second switching device 431b fail simultaneously.

As shown in FIG. 8, the first semiconductor package 407 includes the mounting portions 471 and terminals 472a to 472c. The first semiconductor package 407 is replaceably mounted on the boost chopper circuit body 400a by the mounting portions 471. The boost chopper circuit 400 includes wires 409a to 409e, and a circuit configuration shown in FIG. 7 is formed by connections of the wires 409a to 409e.

The remaining structures of the boost chopper circuit 400 according to the fourth embodiment are similar to those of the boost chopper circuit 200 according to the second embodiment. The remaining operation of the boost chopper circuit 400 according to the fourth embodiment is similar to that of the boost chopper circuit 200 according to the second embodiment.

Effects of Fourth Embodiment

According to the fourth embodiment, the following effects can be obtained.

According to the fourth embodiment, as hereinabove described, both the first switching device 431a and the second switching device 431b are housed in the first semiconductor package 407. Thus, as compared with the case where the first switching device 431a and the second switching device 431b are housed in separate packages, the number of packages is not increased, and hence an increase in the size (complication) of the boost chopper circuit 400 can be significantly reduced or prevented. Although both the first switching device 431a and the second switching device 431b are housed in the first semiconductor package 407, replacement of the switching device that requires no replacement can be prevented due to the failure mode in which there is a high possibility that the first switching device 431a and the second switching device 431b fail simultaneously.

The remaining effects of the boost chopper circuit 400 according to the fourth embodiment are similar to those of the boost chopper circuit 100 according to the first embodiment.

Fifth Embodiment

The structure of a boost chopper circuit 500 according to a fifth embodiment is now described with reference to FIGS. 9 and 10. In the fifth embodiment, the boost chopper circuit 500 is configured as a three-level boost chopper circuit. Both a first switching device 531a and a second switching device 531b are housed in a first semiconductor package 407, and both a first diode 541a and a second diode 541b are housed in a second semiconductor package 308. Portions of the boost chopper circuit 500 similar to those of the boost chopper circuits 100 to 400 according to the aforementioned first to fourth embodiments are denoted by the same reference numerals, to omit the description.

(Structure of Boost Chopper Circuit According to Fifth Embodiment)

Figure 9:
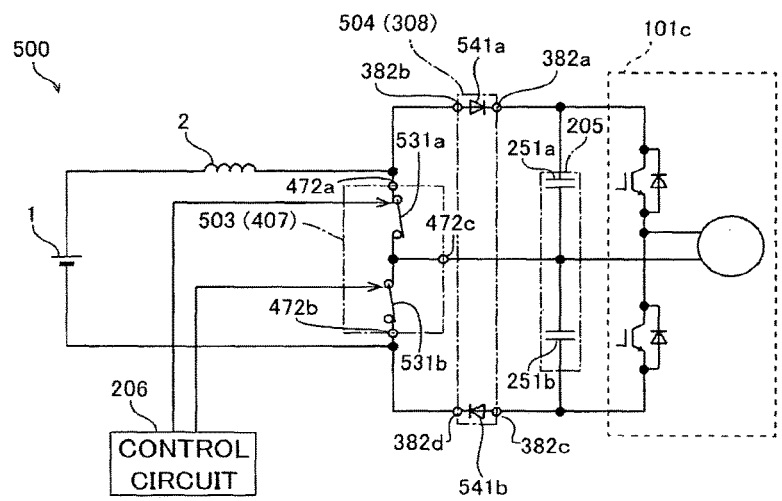
FIG. 9 is an electrical diagram showing the overall structure of a boost chopper circuit according to a fifth embodiment of the present invention.
Figure 10:
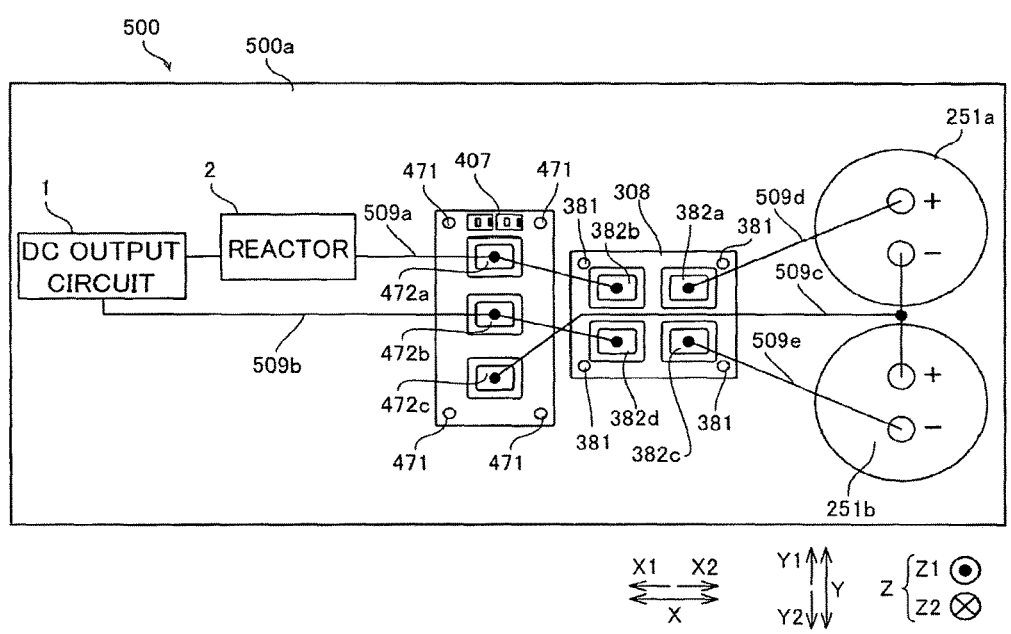
FIG. 10 is a plan view schematically showing the structure of the boost chopper circuit according to the fifth embodiment of the present invention.

As shown in FIGS. 9 and 10, the boost chopper circuit 500 according to the fifth embodiment includes the first semiconductor package 407 and the second semiconductor package 308. Both the first switching device 531a and the second switching device 531b (switching device circuit 503) are housed in the first semiconductor package 407. Both the first diode 541a and the second diode 541b (backflow prevention diode circuit 504) are housed in the second semiconductor package 308.

The first semiconductor package 407 and the second semiconductor package 308 have different shapes from each other, and are replaceably mounted on a boost chopper circuit body 500a. According to the fifth embodiment, the withstanding voltages of the first diode 541a and the second diode 541b are higher than the withstanding voltages of the first switching device 531a and the second switching device 531b. According to the fifth embodiment, the short circuit resistances of the first diode 541a and the second diode 541b are larger than the short circuit resistances of the first switching device 531a and the second switching device 531b.

As shown in FIG. 10, the boost chopper circuit 500 includes wires 509a to 509e, and a circuit configuration (three-level boost chopper circuit) shown in FIG. 9 is formed by connections of the wires 509a to 509e.

The remaining structures and operation of the boost chopper circuit 500 according to the fifth embodiment are similar to those of the boost chopper circuit 200 according to the second embodiment.

Effects of Fifth Embodiment

According to the fifth embodiment, the following effects can be obtained.

According to the fifth embodiment, as hereinabove described, both the first switching device 531a and the second switching device 531b are housed in the first semiconductor package 407, and both the first diode 541a and the second diode 541b are housed in the second semiconductor package 308. Furthermore, the withstanding voltages of the first diode 541a and the second diode 541b are higher than the withstanding voltages of the first switching device 531a and the second switching device 531b. When the second switching device 531b is subject to withstand breakdown and short-circuits, for example, a voltage is applied to the second diode 541b. When this voltage is lower than the withstanding voltage of the second diode 541b, the second diode 541b does not fail, but when this voltage is higher than the withstanding voltage of the second diode 541b (a current value is larger than a short circuit resistance), the second diode 541b is subject to breakdown and/or withstand breakdown. When the withstanding voltage (and the short circuit resistance) of the second diode 541b is not higher than that of the second switching device 531b, the first diode 541a and the second diode 541b are preferably housed in separate semiconductor packages as in the boost chopper circuit 400 according to the fourth embodiment.

On the other hand, according to the fifth embodiment, as hereinabove described, the withstanding voltages and the short circuit resistances of the first diode 541a and the second diode 541b are larger than the withstanding voltages and the short circuit resistances of the first switching device 531a and the second switching device 531b, and hence when the first switching device 531a or the second switching device 531b is subject to withstand breakdown and short-circuits, the possibility that the first diode 541a or the second diode 541b fails simultaneously is reduced. Therefore, the possibility of failure of the first diode 541a or the second diode 541b can be maintained low as compared with the possibility of failure of the first switching device 531a and the second switching device 531b, and hence even when both the first diode 541a and the second diode 541b are housed in the second semiconductor package 308, similarly to the boost chopper circuit 200 according to the second embodiment, replacement of the diodes that require no replacement can be prevented.

The remaining effects of the boost chopper circuit 500 according to the fifth embodiment are similar to those of the boost chopper circuit 100 according to the first embodiment.

MODIFICATION

The embodiments disclosed this time must be considered as illustrative in all points and not restrictive. The range of the present invention is shown not by the above description of the embodiments but by the scope of claims for patent, and all modifications within the meaning and range equivalent to the scope of claims for patent are further included.

For example, while the boost chopper circuit is configured as the two-level boost chopper circuit or the three-level boost chopper circuit in each of the aforementioned first to fifth embodiments, the present invention is not restricted to this. More specifically, the boost chopper circuit may alternatively be configured as a four-or-more-level boost chopper circuit.

While the first semiconductor package(s) and the second semiconductor package(s) have the different shapes from each other in each of the aforementioned first to fifth embodiments, the present invention is not restricted to this. In the case of a manufacturing method in which the first semiconductor package and the second semiconductor package are unlikely to be mistakenly mounted on the boost chopper circuit body, for example, the first semiconductor package(s) and the second semiconductor package(s) may alternatively have the same shape (outer shape).

While the first semiconductor package(s) and the second semiconductor package(s) have the different widths from each other in a plan view, as shown in FIG. 2, as an example in which the first semiconductor package(s) and the second semiconductor package(s) have the different shapes from each other in each of the aforementioned first to fifth embodiments, the present invention is not restricted to this. For example, a difference in shape between the first semiconductor package(s) and the second semiconductor package(s) is not restricted to a difference in width (size), but may alternatively be a difference in any aspect so far as the same is visually recognizable.

While the diode(s) and the switching device(s) each include the wide band gap semiconductor in each of the aforementioned first to fifth embodiments, the present invention is not restricted to this. More specifically, the diode(s) and the switching device(s) each may alternatively include a semiconductor (a silicon semiconductor, for example) other than the wide band gap semiconductor.

What is claimed is:

1. A boost chopper circuit comprising:
a boost chopper circuit body including
a reactor; and
a capacitor circuit connected to the reactor;
a first semiconductor package that includes a plurality of first through-holes and first screws to detachably fasten the first semiconductor package on the boost chopper circuit body, and a switching device circuit connected to two ends of a direct-current output circuit through the reactor and arranged so that the capacitor circuit is between two ends of the switching device circuit; and
a second semiconductor package that is provided separately from the first semiconductor package and includes a plurality of second through-holes and second screws to detachably fasten the second semiconductor package to the boost chopper circuit body, the second semiconductor package having a backflow prevention diode circuit being connected to the switching device circuit and connected in series to the capacitor circuit,
wherein a distance between the plurality of first through-holes arranged adjacent to each other in a predetermined direction and a distance between the plurality of second through-holes arranged adjacent to each other in the predetermined direction are different from each other.

2. The boost chopper circuit according to claim 1, wherein an entirety of the first semiconductor package and an entirety of the second semiconductor package have different shapes from each other.

3. The boost chopper circuit according to claim 1, wherein the backflow prevention diode circuit includes a diode that includes a wide band gap semiconductor.

4. The boost chopper circuit according to claim 1, wherein the switching device circuit includes a switching device that includes a wide band gap semiconductor.

5. The boost chopper circuit according to claim 1, further comprising:
another first semiconductor package that is provided separately from the first semiconductor package, and
another second semiconductor package that is provided separately from the second semiconductor package,
wherein the switching device circuit includes a first switching device and a second switching device connected in series to each other,
the backflow prevention diode circuit includes a first diode connected in series to the first switching device and a second diode connected in series to the second switching device,
the capacitor circuit includes a first capacitor and a second capacitor connected in series to each other,
the first semiconductor package houses the first switching device and the another first semiconductor package houses the second switching device, and
the second semiconductor package houses the first diode and the another second semiconductor package houses the second diode.

6. The boost chopper circuit according to claim 1, wherein the switching device circuit includes a first switching device and a second switching device connected in series to each other,
the backflow prevention diode circuit includes a first diode connected in series to the first switching device and a second diode connected in series to the second switching device,
the capacitor circuit includes a first capacitor and a second capacitor connected in series to each other, and
both the first switching device and the second switching device are housed in the first semiconductor package, or both the first diode and the second diode are housed in the second semiconductor package.

7. The boost chopper circuit according to claim 6, wherein both the first diode and the second diode are housed in the second semiconductor package.

8. The boost chopper circuit according to claim 6, wherein both the first switching device and the second switching device are housed in the first semiconductor package.

9. The step-down chopper circuit according to claim 1, wherein
the first semiconductor package has a length in a first direction of the boost chopper circuit body and a width in a second direction of the booster chopper circuit body perpendicular to the first direction to form a rectangular shape in which the plurality of first through-holes is formed at four corners of the first semiconductor package, respectively, the second semiconductor package has a length in the first direction and a width in the second direction to form a rectangular shape in which the plurality of second through-holes is formed at four corners of the second semiconductor package, respectively, and the length and the width of the first semiconductor package are different from those of the second semiconductor package so that the distance between two adjacent first through-holes in the first direction is different from the distance between two adjacent second through-holes in the first direction.

10. The step-down chopper circuit according to claim 1, further comprising a plurality of wires including a first wire, a second wire, a third wire, a fourth wire, a fifth wire, and a sixth wire to connect the direct-current output circuit, the first semiconductor package, the second semiconductor package, the reactor, and the capacitor circuit, wherein the first semiconductor package includes a first terminal and a second terminal, and the second semiconductor package includes a third terminal and a fourth terminal, and the first wire extends between a positive pole of the direct-current output circuit and one end of the reactor, the second wire extends between another end of the reactor and the first terminal, the third wire extends between the first terminal and the third terminal, the fourth wire extends between the fourth terminal and a positive terminal of the capacitor circuit, the fifth wire extends between a negative terminal of the capacitor circuit and a negative pole of the direct-current output circuit, and the sixth wire extends between the second terminal and the fifth wire.

11. The boost chopper circuit according to claim 1, further comprising:

another first semiconductor package that is provided separately from the first semiconductor package, and includes a plurality of another first through-holes and another switching device circuit; and another second semiconductor package that is provided separately from the second semiconductor package, and includes a plurality of another second through-holes and another backflow prevention diode circuit, wherein only the first semiconductor package is replaced with the another first semiconductor package when the switching device of the first semiconductor package is disabled, and only the second semiconductor package is replaced with the another second semiconductor package when the backflow prevention diode circuit of the second semiconductor package is disabled, without mistaking the first semiconductor package for the second semiconductor package.

* * * * *